United States Patent [19]
Roswell et al.

[11] 3,735,208
[45] May 22, 1973

[54] THERMAL FATIGUE LEAD-SOLDERED SEMICONDUCTOR DEVICE

[75] Inventors: Arthur Edward Roswell, Somerville, N.J.; Gerald Kenneth Clymer, Sellersville, Pa.

[73] Assignee: RCA Corporation, New York, N.Y.

[22] Filed: Aug. 26, 1971

[21] Appl. No.: 175,196

[52] U.S. Cl. ........317/234 R, 317/234 D, 317/234 G, 317/234 L
[51] Int. Cl. ..............................H01l 3/00, H01l 5/00
[58] Field of Search ..........................317/234, 2, 1, 4, 317/4.1, 5.2, 5.3

[56] References Cited

UNITED STATES PATENTS

| | | | |
|---|---|---|---|
| 2,810,873 | 10/1957 | Knott | 317/235 |
| 2,986,678 | 5/1961 | Andres et al. | 317/234 |
| 3,059,158 | 10/1962 | Doucette | 317/234 |
| 3,271,851 | 9/1966 | Hays | 317/234 |
| 3,331,997 | 7/1967 | Kling et al. | 317/234 |
| 3,381,185 | 4/1968 | Whitman et al. | 317/234 |

*Primary Examiner*—John W. Huckert
*Assistant Examiner*—Andrew J. James
*Attorney*—G. H. Bruestle, H. Christoffersen and M. Epstein

[57] ABSTRACT

The device includes a semiconductor die joined to a thermally conductive substrate with a solder having a high lead content. An enclosure surrounds the die and is sealed to the substrate. A substantially nonoxidizing atmosphere is provided within the enclosure.

7 Claims, 1 Drawing Figure

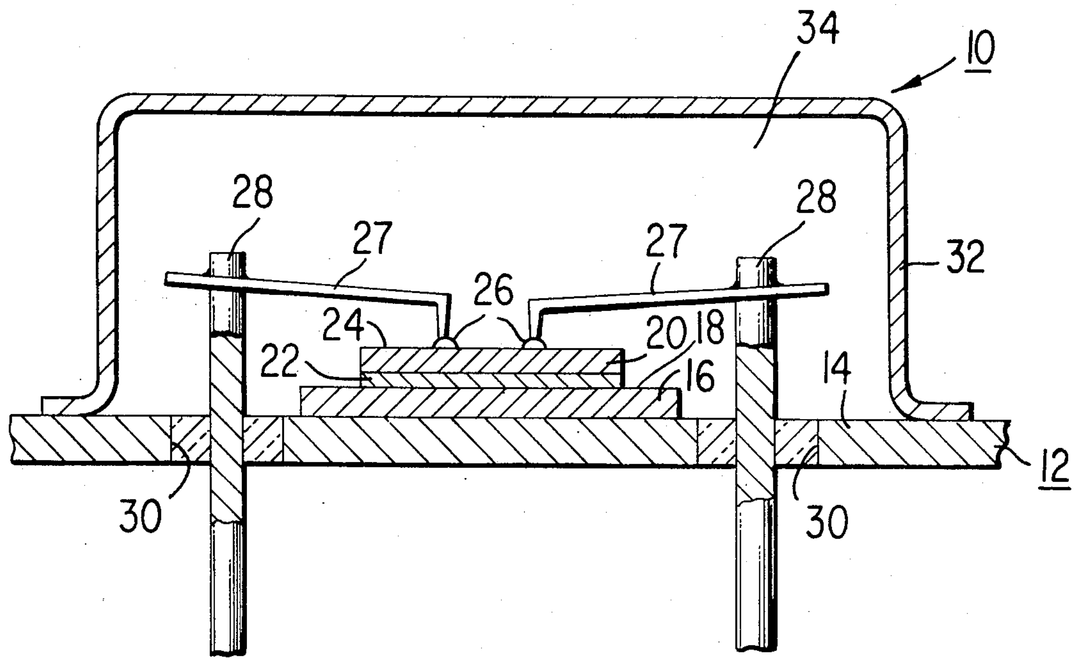
INVENTORS.
GERALD K. CLYMER &
ARTHUR E. ROSWELL
BY Herbert L. Allen
ATTORNEY

THERMAL FATIGUE LEAD-SOLDERED SEMICONDUCTOR DEVICE

BACKGROUND OF THE INVENTION

The present invention relates to power semiconductor devices.

Power semiconductor devices are subject to a serious problem commonly referred to as "thermal fatigue." This problem often results in the failure of such devices after a limited number of operating cycles.

The most significant factor contributing to thermal fatigue is the thermal expansion mismatches between the semiconductor die and the parts of the device upon which the die is mounted. Since the device is constructed of materials that have different thermal expansion coefficients, stress is placed on the die, the solder joint and the substrate upon which the die is mounted. If the stress is severe enough and sufficient cycles encountered, failure is likely to occur. This failure usually occurs as a separation of the die from the substrate or an opening of one of the contact connections. The stress is proportional to the size of the die, the temperature range through which the device is cycled, and the differences in thermal expansion coefficients. Anything which tends to concentrate the stress, such as voids in the solder joint, tends to aggravate this condition.

THE DRAWING

The drawing is a cross-section of a power transistor in accordance with the present invention.

DETAILED DESCRIPTION

A transistor 10 includes a thermally conductive substrate 12, e.g., steel or the like, having a major surface 14. The substrate 12 may also include a high thermal conductivity pedestal 16, as copper, joined to the surface 14.

A transistor die 20 is joined to the upper surface 18 of the pedestal 16 by means of a high lead-content solder joint 22. A "high lead-content solder" is defined as a solder having a lead content of 90 percent or greater, by weight. It has also been found that certain of the common materials used in the high lead-content solders tend to reduce the malleability and annealability of these solders, while other materials have little or no effect. Significant amounts of noble metals have such an effect, while tin has a negligible effect. Therefore, it is especially suitable for this invention to employ a solder consisting essentially of at least 90 percent lead, balance tin, by weight. This solder is also used for contact pads 26, which are deposited on the upper surface 24 of the die 20. The contact pads 26 provide ohmic contact to semiconductor regions within the die, as the emitter and base regions, for example.

The device 10 also includes terminal means between the contact pads 26 and points external to the package. The terminal means include metal posts 28 which extend through insulating disks 30 in the substrate 12, and which are in electrical contact with the contact pads 26 by means of metal clips 27.

An enclosure is provided around the die 20 and the terminal means. Preferably, the enclosure is a metallic cup 32 which is welded to the surface 14 of the substrate 12.

In accordance with the present invention, the atmosphere within the enclosure cup 32 is a substantially nonoxidizing atmosphere, such as nitrogen. In addition, it is extremely desirable that this atmosphere have an oxygen content of less than 100 parts per million, and in which the water content is less than 50 parts per million.

The device 10 is made in the following manner. The starting material is a steel substrate 12 through which terminal posts 28 have already been mechanically sealed and electrically isolated by known techniques. A copper pedestal 16 is then joined to the substrate 12 by brazing.

A transistor die 20, prepared by known techniques and having a thin solder layer on its back surface and contact pads 26 on its top surface, is then placed on the copper pedestal 16 with the solder layer contiguous therewith. The metal clips 27 are placed on the posts 28 and in contact with the contact pads 26; these clips develop a degree of spring tension which is used to jig the die 20 in place during the furnace operation, described below. Solder preforms are placed over the posts 28 in contact with the clips 27. The assembly is then passed through a solder furnace at a temperature above the melting temperature of the solder, but below that of the silicon die and the other materials; for example, a temperature between 350° to 420° C. is suitable. Afterwards, the assembly is cooled, joining the die 20 to the pedestal 16, and the clips 27 to the contact pads 26 and the posts 28.

At this point, it is common practice to cover any PN junctions which extend to the die surface 24 with a silicon passivating layer, such as a silicone junction coating.

The device 10 is then placed in an assembly in which the atmosphere is controlled. The metallic cup 32 is placed over the die in a dry nitrogen gaseous medium like the atmosphere described above, and the cup is welded to the substrate 12. The cup-substrate interface is then subjected to a leak test to insure that a proper hermetic seal has been formed.

Identical power transistors with lead-tin solder joints and contact pads have been made and sealed in dry air, and also sealed in nitrogen in accordance with this invention. Those packages sealed in air failed, as a result of thermal fatigue, after an average of 5,000 operating cycles. Those packages sealed in nitrogen have averaged 50,000 operating cycles each without a significant number of failures due to thermal fatigue.

This improvement in the nitrogen sealed device is thought to be due to the prevention of oxidation of the lead solder joint and the lead contact pads. It is believed that the prevention of the formation of lead oxide allows the solder joint to anneal to its earlier state after each thermal cycle.

Prior art devices utilizing lead solders have consistently used air or uncontrolled nitrogen as a sealing medium. The thermal fatigue capability of other prior art devices which utilize the so-called "hard" solders, e.g., the semiconductor-noble metal eutectics and the high-temperature brazing materials, do not appear to be affected by the sealing atmosphere.

We claim:

1. A semiconductor device comprising:

an enclosure;

a thermally conductive substrate;

a semiconductor die joined to said substrate within said enclosure by means of a joint of a high lead-content solder between said die and said substrate; and a substantially nonoxidizing gaseous medium within said enclosure, said nonoxidizing gaseous medium containing less than 100 parts of oxygen per million parts of said gaseous medium.

2. A device according to claim 1, wherein said nonoxidizing atmosphere contains less than 50 parts of water per million parts of said atmosphere 3. A device according to claim 1, wherein said high lead-content solder consists essentially of at least 90 percent lead, by weight, balance tin.

4. A device according to claim 1, wherein said substrate includes a high thermal conductivity pedestal next adjacent said solder joint.

5. A device according to claim 4, wherein said pedestal consists of copper.

6. A device according to claim 1, further comprising:

at least one contact pad on a surface of said semiconductor die, said contact pad comprising said high lead-content solder; and terminal means interconnecting said contact pad to points external to said enclosure.

7. A transistor comprising:

a thermally conductive substrate having a high thermal conductivity pedestal extending from a surface thereof;

a transistor die joined to said pedestal by means of a joint of a high lead-content solder between said die and said pedestal;

an enclosure surrounding said die and sealed to said substrate at said surface; and a substantially nonoxidizing atmosphere of nitrogen within said enclosure and containing less than 100 parts of oxygen per million parts of said atmosphere.

* * * * *